United States Patent
Kwa

(10) Patent No.: US 9,212,054 B1
(45) Date of Patent: Dec. 15, 2015

(54) PRESSURE SENSORS AND METHODS OF MAKING THE SAME

(71) Applicant: Microlux Technology, San Jose, CA (US)

(72) Inventor: Tom Kwa, San Jose, CA (US)

(73) Assignee: DunAn Sensing, LLC, San Jose, CA (US)

( * ) Notice: Subject to any disclaimer, the term of this patent is extended or adjusted under 35 U.S.C. 154(b) by 0 days.

(21) Appl. No.: 14/515,480

(22) Filed: Oct. 15, 2014

(51) Int. Cl.
| | |
|---|---|
| H01L 21/50 | (2006.01) |
| G01L 9/06 | (2006.01) |
| B81C 1/00 | (2006.01) |
| G01L 9/00 | (2006.01) |

(52) U.S. Cl.
CPC ............ *B81C 1/00674* (2013.01); *G01L 9/0045* (2013.01); *B81C 1/00158* (2013.01); *B81C 1/00277* (2013.01); *B81C 1/00357* (2013.01); *B81C 1/00373* (2013.01); *B81C 1/00396* (2013.01); *B81C 2201/0132* (2013.01)

(58) Field of Classification Search
CPC ............ B81C 1/00674; B81C 1/00158; B81C 1/00373; B81C 1/00277; B81C 1/00357; B81C 1/00396; B81C 2201/0132; B81C 1/00626; G01L 9/0045; G01L 9/0051; G01L 9/0048; G01L 9/0055; G01L 19/147; G01L 9/0042; G01L 9/0054; G01L 19/0069; G01L 9/0073; B81B 2201/0264; Y10T 29/49126; Y10T 29/49007; Y10T 29/49005; Y10T 29/42; Y10T 29/49165
USPC ........................................................ 438/51, 53
See application file for complete search history.

(56) References Cited

U.S. PATENT DOCUMENTS

| 5,295,395 A * | 3/1994 | Hocker | H01L 21/2007 257/E21.122 |
|---|---|---|---|
| 2008/0173096 A1* | 7/2008 | Sato | G01L 19/0069 73/754 |
| 2010/0224004 A1* | 9/2010 | Suminto | B81C 1/00158 73/727 |

* cited by examiner

*Primary Examiner* — Caleen Sullivan
(74) *Attorney, Agent, or Firm* — Dickstein Shapiro LLP

(57) ABSTRACT

A pressure sensor assembly comprising: three stacked silicon wafers which form a support, a sensor and a cover wherein the sensor includes a cavity extending from the bottom of the sensor up towards the top of the sensor to form a cavity bottom and a diaphragm; a dielectric layer covering the bottom of the sensor and the cavity and wherein the support is coupled to the dielectric layer along the bottom of the sensor; a plurality of ports located on a top of the support within an area defined by the cavity, the plurality of ports extending through the support to its bottom and wherein the cover is coupled to the top of the sensor covering the diaphragm; and, a second cavity cut into a bottom of the cover wherein the second cavity is sized and positioned to surround the diaphragm.

19 Claims, 8 Drawing Sheets

PRESSURE SENSORS AND METHODS OF MAKING THE SAME

TECHNICAL FIELD

The present patent document relates to pressure sensors and methods of making the same. More particularly, the present patent document relates to pressure sensors made from silicon wafers.

BACKGROUND

Current designs of pressure sensors for high pressure backside applications are inadequate for many applications. Typical pressure sensors use a diaphragm as the pressure detecting element of the pressure sensor. The diaphragm is exposed to a positive or negative pressure on only one side creating a pressure differential across the diaphragm. This pressure differential causes the diaphragm to flex and the amount of flex may cause a change in, e.g., resistance or capacitance, which may be measured with an electrical circuit.

One problem with current designs is that they do not limit the flow of pressure to the diaphragm. Accordingly, when the pressure sensor is exposed to a drastic change, the diaphragm experiences a very rapid pressure change. This rapid pressure change could cause the diaphragm to flex past its yield point and permanently damage the diaphragm and ultimately the pressure sensor.

Another issue with the current design is that the silicon diaphragm is directly exposed to the medium of which the pressure is to be measured. A conductive fluid at high electric potential impinging on the silicon surface will cause a large electric current to flow through the sensor and result in damage to the sensor and/or the circuitry attached to it.

Yet another issue with the current design is that there is no means of detection when the diaphragm has reached its displacement limit. Such a means of detection could be used to mitigate the displacement limit condition.

SUMMARY OF THE EMBODIMENTS

In view of the foregoing, an object according to one aspect of the present patent document is to provide a pressure sensor assembly. Preferably the methods and apparatuses address, or at least ameliorate one or more of the problems described above. To this end, a pressure sensor assembly is provided. In one embodiment, the pressure sensor assembly comprises: a first silicon wafer with a top and a bottom; a cavity formed in the silicon wafer, the cavity extending from the bottom of the first silicon wafer up towards the top of the first silicon wafer to form a cavity bottom such that a diaphragm is formed between the cavity bottom and the top of the first silicon wafer; a dielectric layer covering the bottom of the first silicon wafer and the cavity; a conductive layer, e.g., a metal such as aluminum, or highly doped polysilicon, covering the top of the diaphragm in the first silicon wafer; a second silicon wafer coupled to the dielectric layer along the bottom of the first silicon wafer and covering the cavity; a plurality of ports located on a top of the second silicon wafer within an area defined by the cavity, the plurality of ports extending through the second silicon wafer to a bottom of the second silicon wafer; a third silicon wafer coupled to the top of the first silicon wafer such that the third silicon wafer covers the diaphragm; and, a second cavity cut into a bottom of the third silicon wafer wherein the second cavity is sized and positioned such that the second cavity surrounds the diaphragm.

In preferred embodiments, the depth of the second cavity is designed to mechanically limit motion of the diaphragm to less than 3 times a full-scale pressure displacement. In an even more preferred embodiment the depth of the second cavity is less than or equal to 0.9 µm.

In yet other embodiments, the second cavity may also include a means to electronically detect that the diaphragm has reached its displacement limit. In such embodiments, a conductive layer may cover, or be appropriately placed on, the cavity bottom. A corresponding conductive layer may cover, or be appropriately placed on, the top of the diaphragm. Accordingly, when the diaphragm reaches its maximum displacement, the conductive layer on top of the diaphragm comes in contact with the conductive layer on the bottom of the second cavity. The layers may be appropriated designed, sized and shaped such that contact between the layers completes an electrical circuit, thus electronically detecting the maximum displacement of the diaphragm has occurred. In some embodiments, the conductive layer in the bottom of the second cavity may be in electrical communication with a contact located on another area of the sensor assembly. In a preferred embodiment, this contact may be located on top of the third silicon wafer. The conductive layers may be made from a metal such as aluminum, or highly doped polysilicon.

In some embodiments, the cavity bottom that forms the diaphragm is at least 80% of the way to the top of the first silicon wafer. In other embodiments other depths may be used.

In preferred embodiments, the dielectric layer insulates the electric circuit on the sensor from the medium impinging on the diaphragm. In preferred embodiments, the dielectric layer insulates the electric circuit on the sensor from the support. In preferred embodiments, the dielectric layer is made of silicon dioxide or silicon nitride or a combination of silicon dioxide and silicon nitride. In some embodiments, no dielectric layer is used and the first wafer is coupled directly to the second silicon wafer.

In some embodiments, the pressure sensor assembly may be further coupled to a substrate. In such embodiments, the substrate may be coupled to the bottom of the second silicon wafer. The substrate may include a channel that runs from a top of the substrate to a bottom of the substrate. The channel opening at the top of the substrate may cover the plurality of port openings on the bottom of the second silicon wafer. In some embodiments, the substrate may be a pedestal.

Other embodiments of a pressure sensor assembly are also described. In one embodiment, the pressure sensor assembly comprises: a first silicon wafer having a top surface and a bottom surface and a mid-plane defined half-way between the top surface and the bottom surface wherein the bottom surface includes a cavity that extends up towards the top surface past the mid-plane to a cavity bottom; a diaphragm formed between the cavity bottom and the top surface; a second silicon wafer coupled to the bottom surface of the first silicon wafer, the second silicon wafer covering the cavity to form a chamber; a plurality of channels that extend through the second silicon wafer and into the chamber; a third silicon wafer coupled to the top surface of the first silicon wafer, the third silicon wafer including a second cavity, the second cavity sized and positioned to cover the diaphragm and wherein a bottom of the second cavity forms a mechanical stop for the diaphragm; and wherein the first silicon wafer and the second silicon wafer are electrically isolated from each other by a dielectric layer deposited between them.

In preferred embodiments, the bottom of the second cavity may be covered with a conductive layer positioned to close an electrical circuit if the pressure applied to the diaphragm causes a conductive layer on top of the diaphragm to come in contact with the conductive layer on the bottom of the second cavity.

In another aspect of the present patent document, a method for manufacturing a pressure sensor assembly is provided. In a preferred embodiment, the method comprises: forming a sensor from a first silicon wafer by creating a cavity that extends up into the first silicon wafer from a bottom; forming a conductive layer over the top of the first silicon wafer; forming a dielectric layer over the bottom and cavity of the first silicon wafer; forming a support from a second silicon wafer by creating a plurality of channels that pass through the second silicon wafer from a top surface to a bottom surface; bonding the bottom of the first silicon wafer to the top surface of the second silicon wafer such that a chamber is formed by the cavity and the plurality of channels open into the chamber; forming a cover from a third silicon wafer by creating a second cavity that extends up into the third silicon wafer from a bottom; bonding the bottom of the third silicon wafer to a top of the first silicon wafer such that the second cavity surrounds the diaphragm.

In some embodiments, the depth of the second cavity is cut to mechanically limit motion of the diaphragm to less than 3 times a full-scale pressure displacement. In some methods, the depth of the second cavity is less than or equal 0.9 μm, 1.1 μm, 1.3 μm or 1.5 μm.

In other embodiments, a conductive layer may also be formed in the bottom of the cavity of the third silicon layer. The conductive layer may be in electrical communication with a contact located on the top of the third silicon wafer. In addition, a conductive layer may also be formed on top of the diaphragm of the first silicon layer. The conductive layer may be positioned such that when the diaphragm reaches a maximum displacement condition, the conductive layer on top of the diaphragm comes in electrical communication with the conductive layer on the bottom of the cavity in the third silicon wafer and completes a circuit, which may be used to detect the maximum displacement condition.

In some embodiments of the method, the dielectric layer is made of silicon dioxide or silicon nitride or a combination of silicon dioxide and silicon nitride. And, in some embodiments of the method, the pressure sensor assembly is coupled to a substrate at the bottom of the support.

As described more fully below, the embodiments of a pressure sensor described herein ameliorate or alleviate some of the problems described above. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

The words "top" and "bottom" are used in the description that follows to help provide an orientation to the reader. The words are not meant to limit the scope of the embodiments to those oriented a particular direction with respect to gravity but rather simply to provide a relative orientation and/or direction with respect to other parts or portions of a particular embodiments. For example, if the direction "top" is established, the "bottom" will be the opposite side of the embodiment from the top and vice versa. Accordingly, "up" is in a direction from the "bottom" towards the "top" and down is in a direction from the "top" towards the "bottom."

Figure 1:
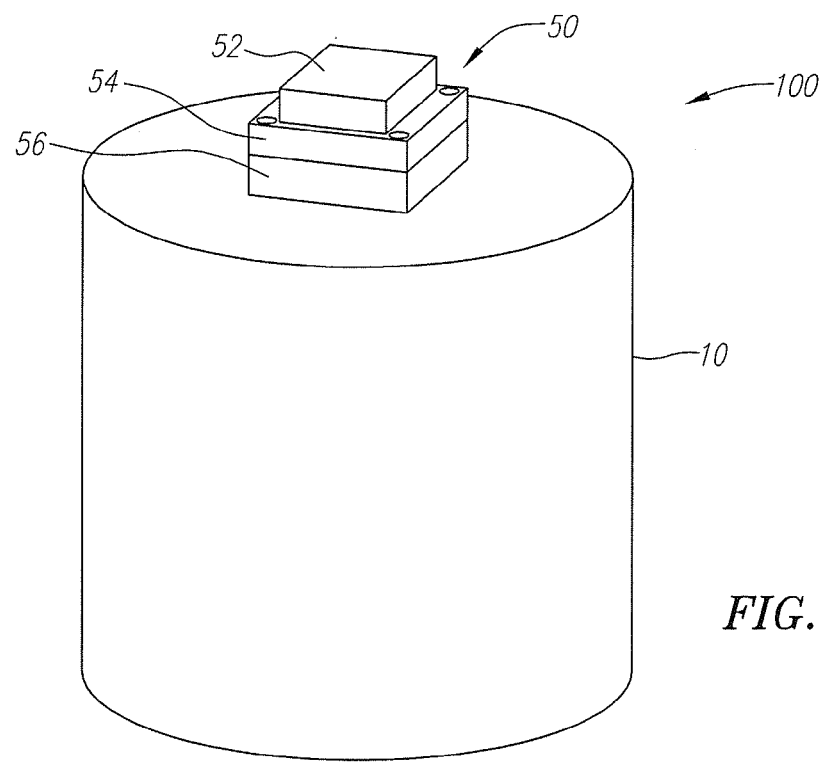
FIG. 1 illustrates an isometric view of one embodiment of a pressure sensor assembly mounted on a substrate.

FIG. 1 illustrates an isometric view of one embodiment of a pressure sensor assembly mounted on a substrate. In the embodiment shown in FIG. 1, the entire assembly 100 is comprised of the pressure sensor assembly 50 and a substrate 10. The pressure sensor assembly 50 may be coupled to the substrate 10 using a number of different methods. In a preferred embodiment, the pressure sensor assembly 50 is bonded to the substrate 10 by a eutectic bonding technique, a glass-frit bonding technique, or an adhesive bonding technique. The substrate 10 shown in FIG. 1 is exemplary and many other sizes or shapes of substrate 10 may be used.

The pressure sensor assembly 50 is comprised of a cover 52, a sensor 54 and a support 56. In embodiments that include a substrate 10, the support 56 is coupled to the top of the substrate 10. The sensor 54 is coupled to the top of the support 56 and the cover 52 is coupled to the top of the sensor 54.

In a preferred embodiment, the cover 52, sensor 54 and support 56 are all made from silicon (Si). In an even more preferred embodiment, the cover 52, sensor 54 and support 56 are all made from a silicon wafer. Accordingly, the sensor assembly may be comprised by three stacked silicon wafers. In other embodiments, other materials may be used. Making the components of the sensor assembly 50 from silicon is advantageous because they may be manufactured using advance manufacturing techniques such as those used in Microelectromechanical Systems (MEMS) devices. In general, the sensor assembly 50 may be a MEMS device.

Typical silicon wafers for use with the preferred embodiments may be between 300 μm and 400 μm in thickness. In a preferred embodiment, the silicon wafer has a thickness of 350 μm. In other embodiments, other thicknesses may be used for the silicon wafers of the cover 52, sensor 54 and support 56. In different embodiments, different thicknesses may be used for each component. In a preferred embodiment, the crystalline orientation of the silicon wafer is 100 on the Miller index. However, other crystalline orientations may be used in other embodiments.

In a preferred embodiment, the cover 52, sensor 54 and support 56 are all made of silicon wafers and are bonded together with a silicon bond. However, other bonding techniques may be used and in particular, other bonding techniques may be used if a material other than a silicon wafer is used.

Figure 2:
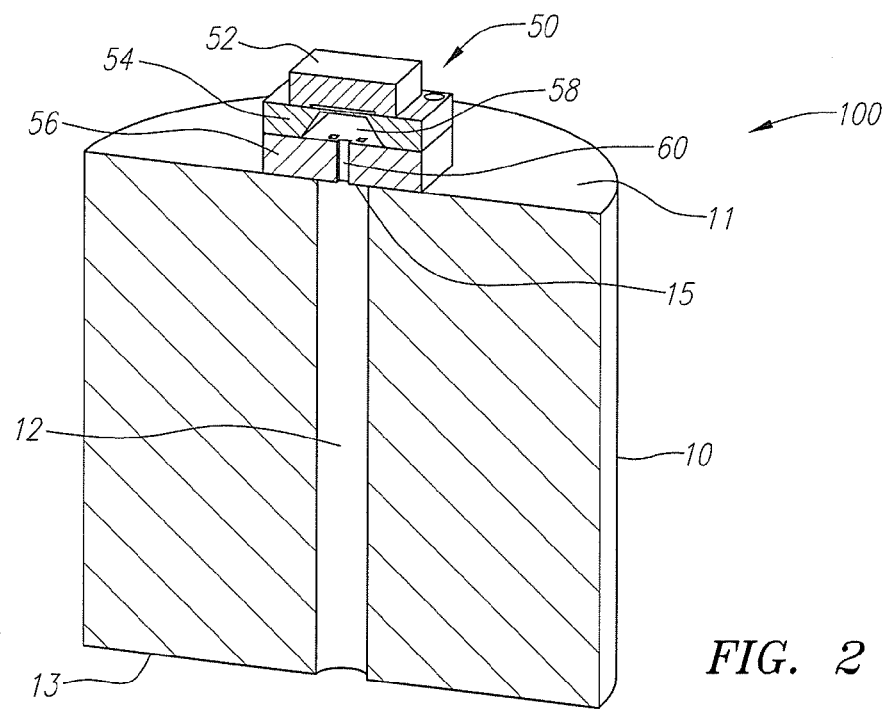
FIG. 2 illustrates a cross sectional view of the pressure sensor assembly of FIG. 1.

FIG. 2 illustrates a cross sectional view of the embodiment of a pressure sensor assembly 50 including a substrate 10 of FIG. 1. The pressure sensor assembly 50 is coupled to the substrate 10 at the bottom of the support 56. In the embodiment shown in FIG. 2, the substrate includes a channel 12 that runs from a top 11 of the substrate 10 to a bottom 13 of the substrate 10. In other embodiments, other types of channels may be used. The channel in the substrate 10 may be all the same diameter or may include more than two different diameters or may be square or rectangular or polygonal. The channel in the substrate 10 may be of various different designs but should provide communication from the bottom of the pedestal 10 up to the bottom of the support 56.

As may be seen in FIG. 2, the support 56 includes a plurality of ports 60 and the sensor 56 includes a cavity 58. The bonding of the support 56 to the sensor 54 causes the cavity 58 to become a chamber 58. The plurality of ports 60 extend through the thickness of the support 56. In preferred embodiments, the openings of the ports are aligned such that they open in the chamber 58. The plurality of ports 60 provide a path for the pressure to pass from the bottom of the support 56 up into the cavity 58.

Figure 3:
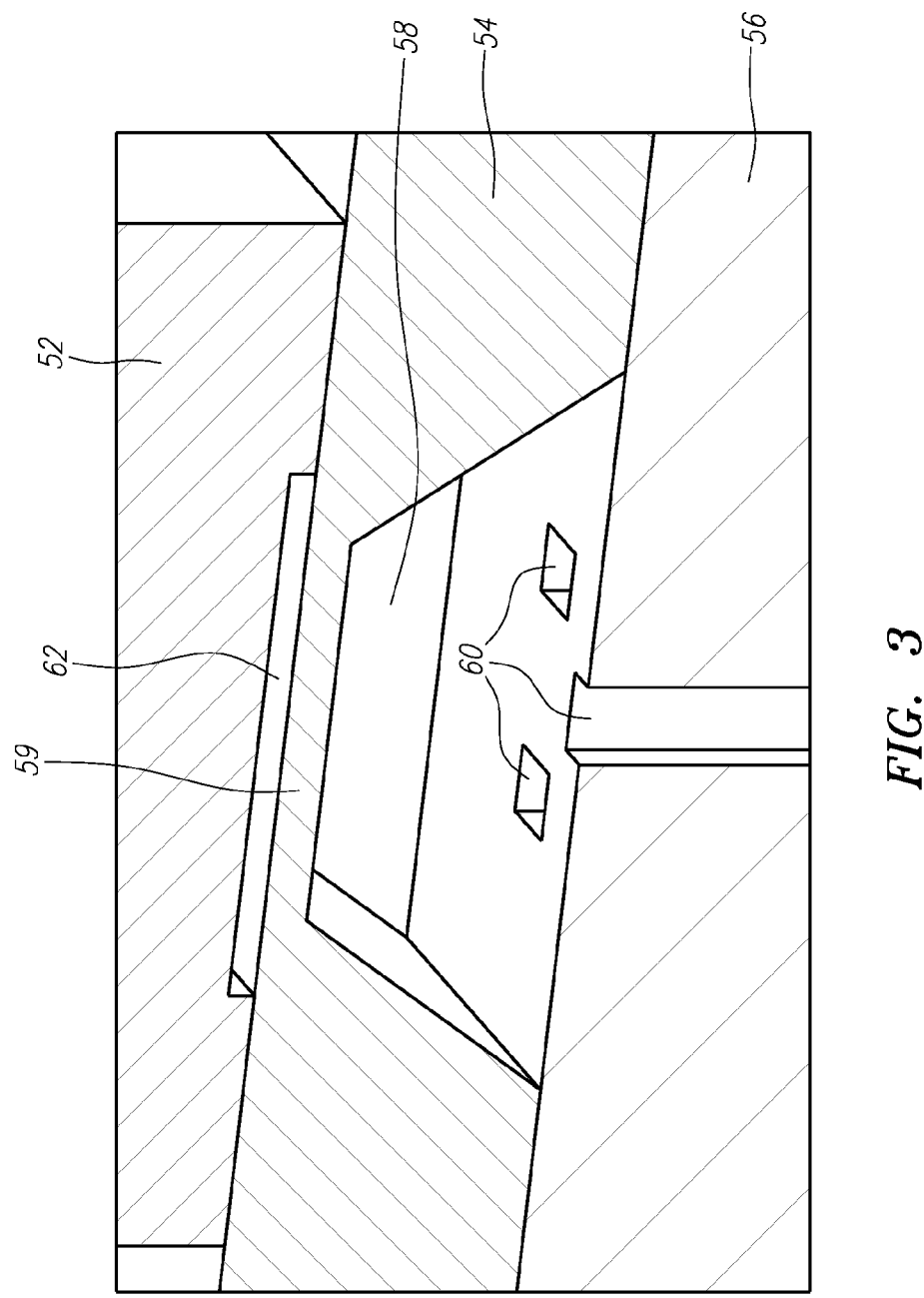
FIG. 3 illustrates a close up view of the cross section of FIG. 2.

FIG. 3 illustrates a close up view of the cross section of FIG. 2. As may be seen in FIG. 3, a plurality of ports 60 extend through the support 56. The ports 60 may also be referred to as channels or an array of channels. Using a plurality of smaller ports 60 is advantages over a single larger port because the array of smaller ports 60 dampen the pressure spike of the inrushing medium to protect the sensor 54. In particular, the plurality of ports 60 dampen the pressure spike to the diaphragm 59 of the pressure sensor 54. In preferred embodiments, the plurality of ports 60 are constructed with a significantly reduced diameter from a typical single larger port. In preferred embodiments, the ports 60 are formed by drilling holes into the support 56 using a Deep Reactive-Ion Etch (DRIE) tool or by ultrasonic drilling or by mechanical drilling. The shape of the ports 60 can be round or square or rectangular or polygonal. The flow velocity $V_f$ in each channel is a function of the pressure difference $\Delta p$ between the pressure $P_{out}$ outside the chamber 58 and the pressure $P_{in}$ inside the chamber 58, the density of the fluid $\rho$, the ratio of the diameter D of the channel to the length L of the channel, and the friction coefficient $f_D$ inside the channel. This relationship is described by the equation:

$$V_f = \sqrt{\frac{2 \cdot \Delta p \cdot D}{\rho \cdot f_D \cdot L}}$$

To this end, the diameter and length of the ports 60 may be selected such that the flow of the medium into the chamber is reduced compared to a single large port. In preferred embodiments, for the fluid and the maximum pressure difference for which the sensor will be used, the ratio D/L is selected such that the flow is reduced to $1/10^{th}$ of the flow when a single large port is employed. In other embodiments, other reduction ratios may be designed for.

In the embodiment shown in FIG. 3, five ports extend from the bottom of the support 56 up into the chamber 58. However, in other embodiments other number of ports may be used. In a preferred embodiment, between 2 and 10 ports are used. In a more preferred embodiment, between 5 and 10 ports are used. In yet other embodiments between 5 and 50 ports may be used. In still yet other more complex embodiments, 50 or more ports may be used.

In embodiments where the ports are confined to the thickness of the support 56, the length of the ports 60 is defined by the thickness of the silicon wafer. Accordingly, only a diameter needs to be selected. In a preferred embodiment, the diameter of a port is $1/100$ or less the maximum diameter of the chamber 58. In yet other embodiments, the diameter of a port is $1/25$ to $1/15$ the maximum diameter of the chamber 58. In still yet other embodiments, the diameter of a port is $1/15$ to $1/10$ of the maximum diameter of the chamber 58. In still yet other embodiments, the diameter of a port is $1/10$ to $1/5$ the maximum diameter of the chamber 58.

The plurality of ports 60 may be aligned with the channel opening 15 at the top of the substrate 10 such that the channel opening 15 covers the plurality of port openings 60 on the bottom of the support 56. In other embodiments, some portion of or more of the port openings 60 may be outside the channel opening 15.

As may be seen in FIG. 3, the sensor 54 includes a cavity 58. The cavity extends from the bottom surface of the sensor 54 down to a cavity bottom such that a diaphragm is formed between the cavity bottom and the top of the sensor 54. In a preferred embodiment, the cavity bottom extends at least 80% of the way towards the top surface of the sensor 54. In an even more preferred embodiment, the cavity bottom extends between 85% and 95% of the way to the top surface of the sensor 54. The depth of the cavity 58 determines the diaphragm 59 thickness which in turn determines the full-scale pressure range of the pressure sensor 54. The thickness of the sensor 54 is the distance between the bottom surface and the top surface. The sensor 54 has a mid-plane half-way between the top surface and the bottom surface. In preferred embodiments, the cavity 58 extends up towards the top surface past the mid-plane to a cavity bottom.

The minimum diaphragm thickness 59 (or maximum cavity 58 depth) is dictated by the output target and limited by the manufacturing process. There is no maximum diaphragm 59 thickness (or minimum cavity 58 depth). In a preferred embodiment, the diaphragm 59 thickness is typically from 10 μm to 95% of the sensor wafer thickness.

The sensor 54 includes an electric circuit disposed on the top side of the sensor 54. The electrical circuit is used to measure the deflection of the diaphragm and thus, the pressure. The electric circuit may be formed by a conductive layer 51. The conductive layer may be made from any metal. The conductive layer 51 is used to form circuitry embedded in the silicon of the sensor. In preferred embodiments, the conductive layer 51 is a different conductive layer from conductive layer 57 (shown in FIG. 6A). In some embodiments, they may be made from different materials and/or have different thicknesses. In other embodiments, the conductive layer 57 may be formed as part of the electrical circuit 51 or may be attached thereto.

In order to electrically isolate the electrical circuit from a potential short circuit, a dielectric layer may be used between the sensor 54 and the support 56. In preferred embodiments, the dielectric layer covers both the cavity 58 and the bottom side of the sensor 54. The dielectric layer may be made from any insulating material. In a preferred embodiment, the dielectric layer is made of silicon dioxide or silicon nitride.

The primary source of a potential short to the electric circuit is created when a conductive fluid at high electric potential enters the sensor assembly and impinges on the silicon surface. Contact between the fluid at high electrical potential and the silicon may cause a large electric current to flow through the sensor and result in damage to the sensor and/or the circuitry attached to it. Accordingly, the electric circuit needs to be electrically isolated from the cavity and channels which harbor the incoming fluid. This may be accomplished as seen in the cross section of a sensor assembly 50 in FIG. 11 where a dielectric layer 30 covers the entire bottom surface of the sensor. In a preferred embodiment, this includes the surface of the cavity 58 and the surface between the sensor 54 and the support 56. In another embodiment, the same electrical isolation may be accomplished by applying a dielectric layer 30 over all the surfaces exposed to the incoming fluid as may be seen in the cross section of a sensor assembly 50 shown in FIG. 10. In a preferred embodiment, this may include the entire chamber 58 and the surfaces of the ports 60.

Returning to FIG. 3, the cover 52 is coupled to the top of the sensor 54. In a preferred embodiment, the cover 52 also includes a cavity 62. The cavity 62 is cut into the cover 52 on the side coupled to the sensor 54. The cavity 62 extends up into the cover to a cavity bottom. Thus, when the cover 52 is assembled to the sensor 54, the cavity 62 forms a gap above the diaphragm 59. In a preferred embodiment, the cavity 62 in the cover 52 is sized and positioned such that the cavity 62 surrounds the bottom of the diaphragm 59. Also in a preferred embodiment, the depth of the cavity 62 is designed such that the bottom of the cavity 62 limits the motion of the diaphragm 59 towards the cover 52. Thus, the cavity is sized and positioned such that when the cover is coupled to the sensor 54, the bottom of the cavity 62 acts as a mechanical stop to excessive displacement of the diaphragm 59.

In a preferred embodiment, the diaphragm 59 is typically displaced about 0.3-0.5 µm at full-scale pressure. To be effective as a stop, the gap formed by the cavity 62 needs to be greater than the full-scale displacement but less than the distance where the diaphragm will yield or burst if no stop is present. A diaphragm yield or rupture typically occurs at 3 to 5 times the full-scale pressure displacement. Accordingly, for a diaphragm with a typical full scale displacement of 0.3 µm, the cavity 62 may have a depth greater than 0.3 µm but less than 0.9 µm. In yet another embodiment with a diaphragm with a typical full scale displacement of 0.3 µm, the cavity 62 may have a depth greater than 0.3 µm but less than 1.5 µm. In other embodiments, other cavity depths may be used depending on the design of the diaphragm.

A series of figures will now be described to illustrate the process of constructing one embodiment of a pressure sensor assembly 50. The pressure sensor assembly 50 in this embodiment will be constructed from 3 separate silicon wafers bonded together. The pressure sensor assembly 50 will include a plurality of ports 60, a cover 52 with a mechanical stop and a dielectric layer to electrically isolate the sensor 54 from the support 56. In other embodiments, other combination or configuration may be constructed.

Figure 4:
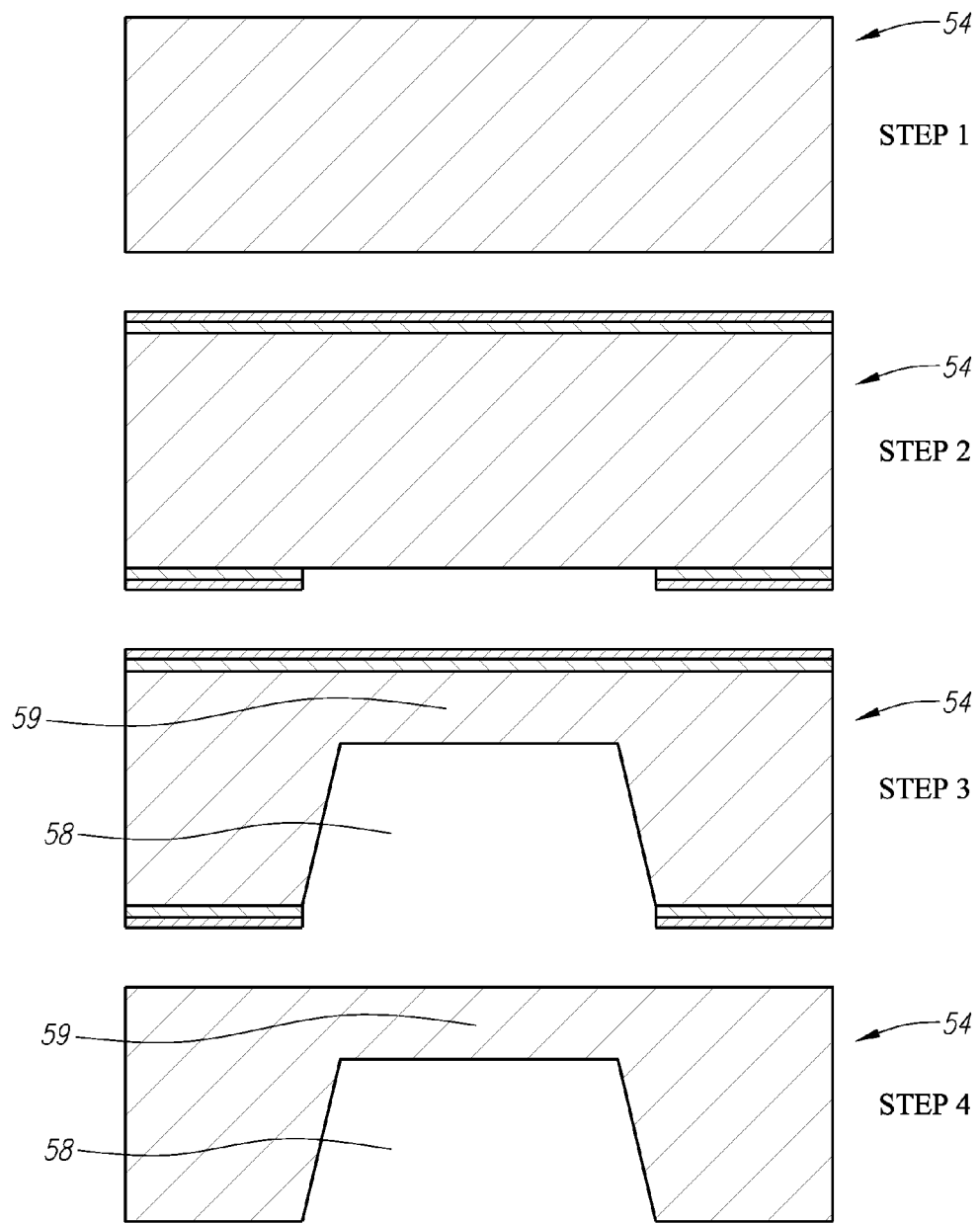
FIG. 4 illustrates a plurality of cross sections of a silicon wafer during the process of forming one embodiment of a sensor.

FIG. 4 illustrates a plurality of cross sections of a silicon wafer during the process of forming one embodiment of a sensor 54. In step 1, the process preferably begins with an n-type <100> Si wafer, 10 Ωcm+/−20% with a 350 µm thickness. In step 2, an oxidation layer is added along with SiN deposition. In a preferred embodiment a photoresist spin is performed. The cavity mask is created by an appropriately placed and sized SiN etch and oxide etch followed by a photoresist strip. In step 3, a KOH etch is used to create the cavity 58 of the sensor 54 and accordingly, the diaphragm 59. The KOH etch is preferably to a depth of about 90% of the wafer thickness. Corner rounding is preferably also performed in this step. In step 4, the SiN and oxide layers are stripped.

Figure 5:
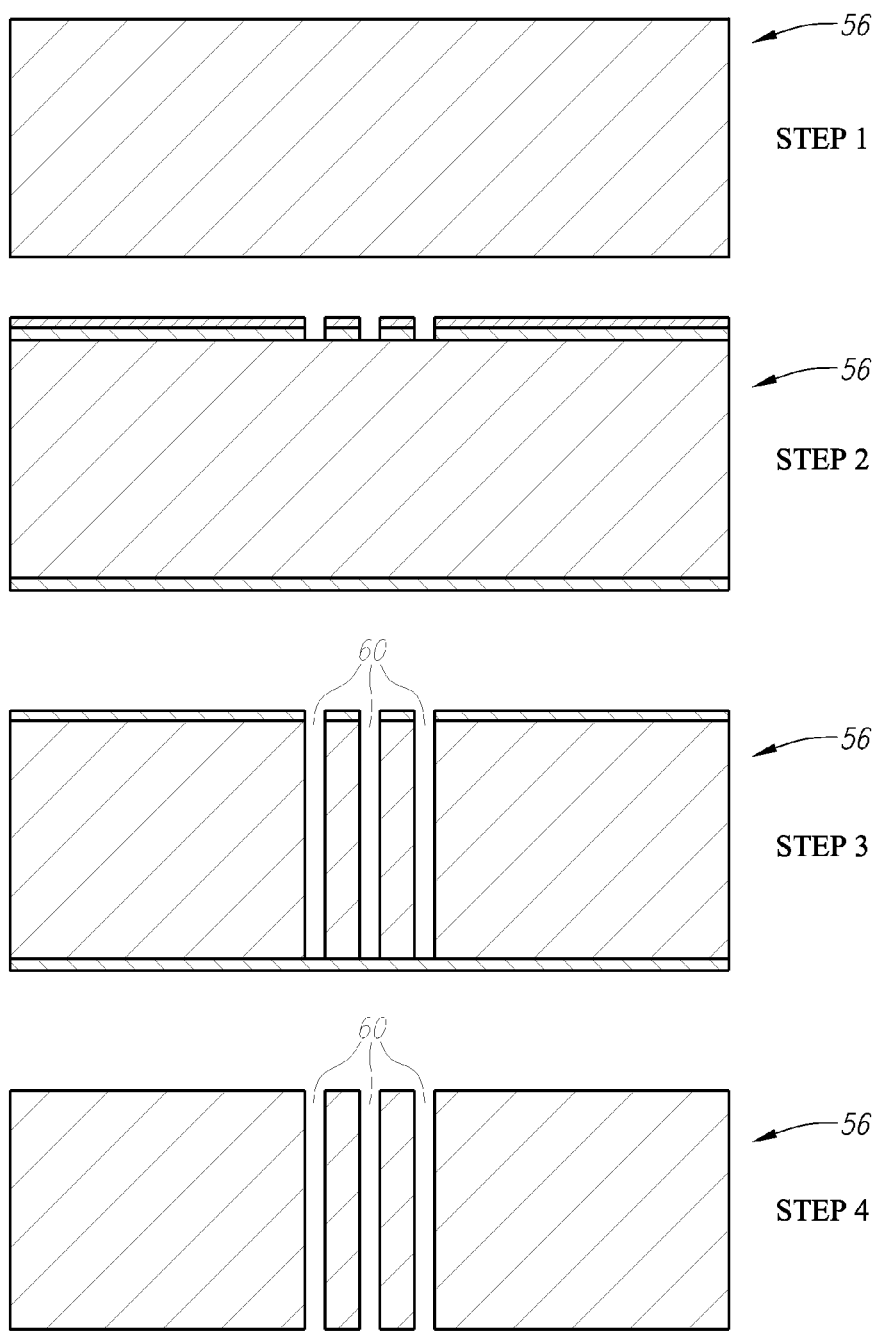
FIG. 5 illustrates a plurality of cross section of a silicon wafer during the process of forming one embodiment of a support.

FIG. 5 illustrates a plurality of cross section of a silicon wafer during the process of forming one embodiment of a support 56. In step 1, the process preferably begins with a <100> Si wafer with a 350 µm thickness. In step 2, the mask for the plurality of ports 60 is created by applying an oxidation layer, performing a photoresist spin and then exposing the port mask with an oxide etch. In step 3, the plurality of ports 60 are formed with deep reactive ion-etching (DRIE) followed by a photoresist strip. Finally in step 4, the oxide layer is stripped off.

Figure 6:
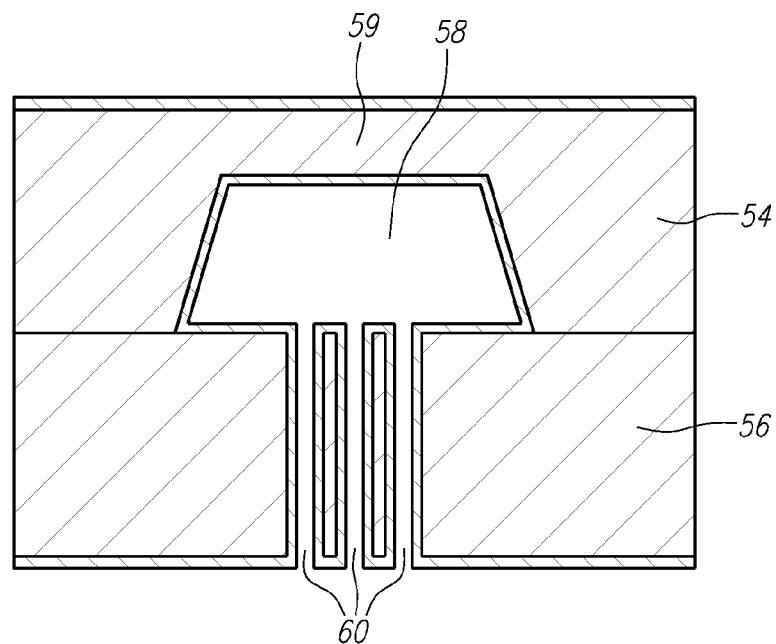
FIG. 6 illustrates a cross section of the combination of the sensor from FIG. 4 with the support from FIG. 5.

FIG. 6 illustrates a cross section of the combination of the sensor 54 from FIG. 4 with the support 56 from FIG. 5. In a preferred embodiment, the two silicon wafers are silicon-to-silicon bonded. The assembly is then oxidized to prepare to form the electrical circuit that detects the diaphragm displacement on the top surface of the sensor 54. A series of steps is performed to form the electrical circuit as is well known to those skilled in the art. Included in this series of steps is the deposition and patterning of a metal, for example, aluminum. The patterned metal may not only form the electrical circuit, it may also serve as part of the electrical contact that forms the maximum displacement detection switch on the top side of the diaphragm 59.

Figure 6A:
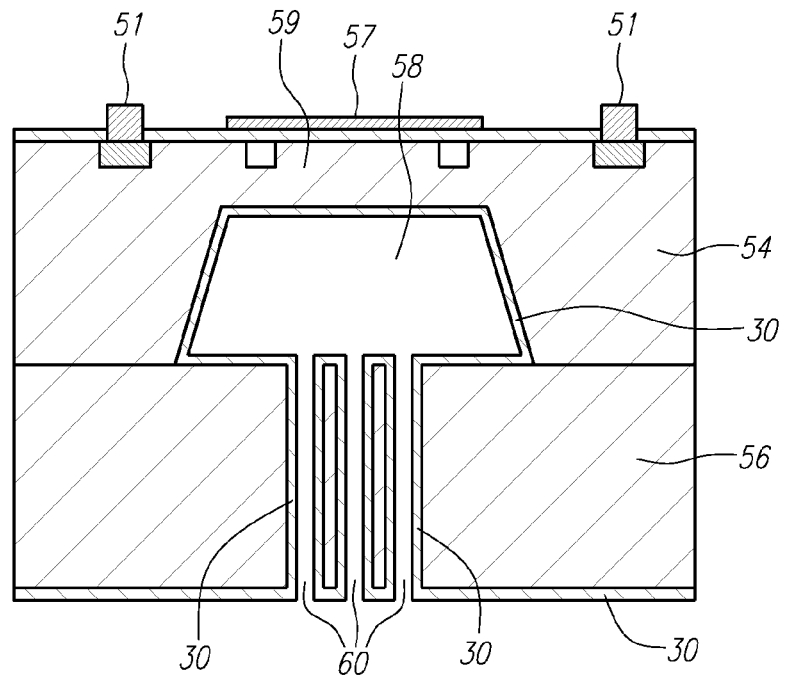
FIG. 6A illustrates the cross section of FIG. 6 with a conductive layer added to the top surface of the pressure sensor.

FIG. 6A illustrates the cross section of FIG. 6 with a conductive layer 57 added to the top surface of the pressure sensor 54. As may be seen in FIG. 6A, a portion of the conductive layer may be formed over the diaphragm 59 to provide a contact for the maximum displacement switch.

Figure 7A:
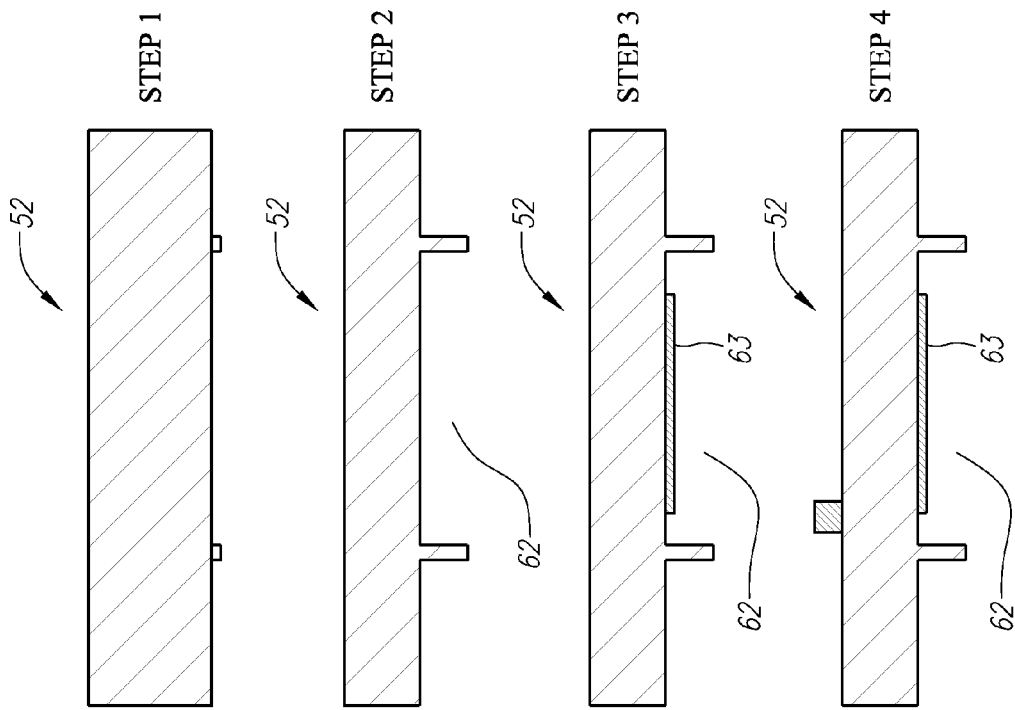
FIG. 7A illustrates a plurality of cross sections of a silicon wafer during the process of forming an embodiment of a cover configured to electronically detect a maximum displacement condition of the diaphragm.
Figure 7:
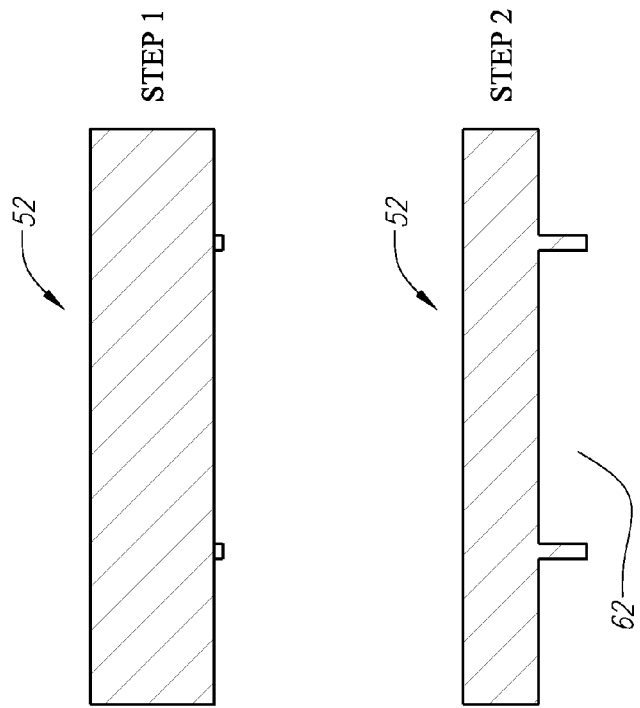
FIG. 7 illustrates a plurality of cross sections of a silicon wafer during the process of forming one embodiment of a cover.

FIG. 7 illustrates a plurality of cross sections of a silicon wafer during the process of forming one embodiment of a cover 52. In step 1, the process preferably begins with a <100> Si wafer, 0.1 Ωcm or less with a 350 µm thickness. In step 2, a photoresist spin is performed followed by a recess mask. The cavity 62 is formed by DRIE. Then a photoresist strip is performed.

FIG. 7A illustrates a plurality of cross sections of a silicon wafer during the process of forming an embodiment of a cover configured to electronically detect a maximum displacement condition of the diaphragm. In preferred embodiments, the cover 52 may not only act as a mechanical stop, but may also be configured to act as an electrical detection switch. In such embodiments, the cavity 62 is covered with a conductive layer 63 which is electrically connected to the cover 52. The conductive layer may be made from any metal. Thus, when the diaphragm 59 reaches the bottom of cavity 62, the conductive layer 57 on the diaphragm 59 will come into contact with the conductive layer 63 in the cavity of the cover 52. Preferably, the contact forms a closed circuit. This closed circuit may be detected with a detection circuit which may disable the source of the high pressure or provide relief by opening another valve.

As may be seen in FIG. 7A, in step 3, a conductive layer, such as aluminum, is deposited on the bottom side of the cover 52. Then a photoresist spin is performed followed by a masking and etching step. In step 4, a conductive layer, such as aluminum, is deposited on the top side of the cover 52. The conductive layer on the top side of the cover 52 may be used as a contact to the conductive layer 63. Then, a photoresist spin is performed followed by a masking and etching step.

Figure 8:
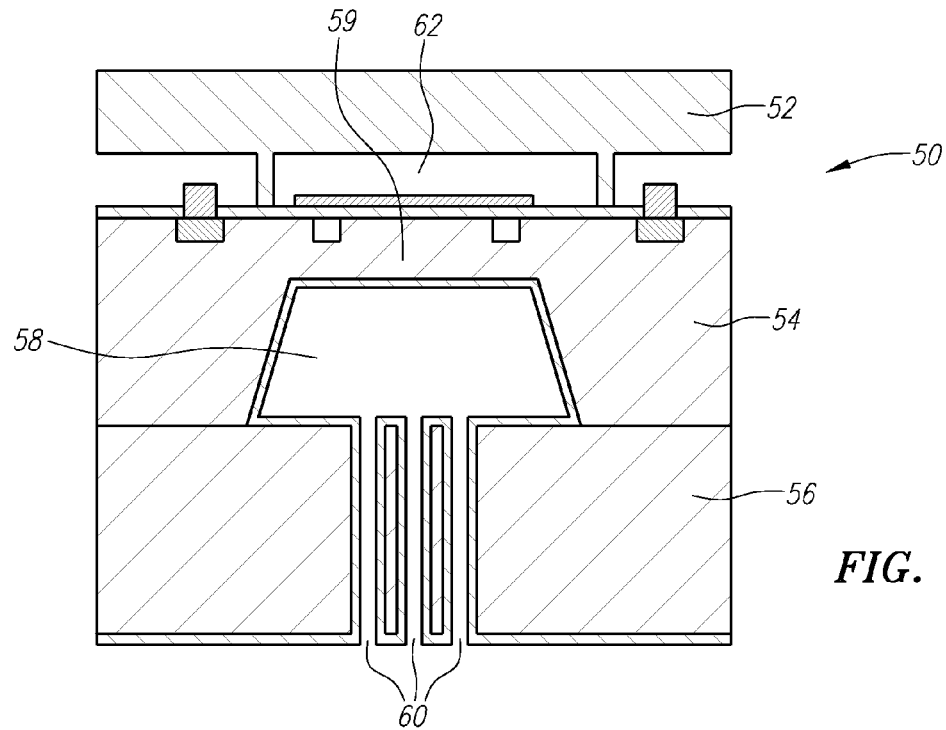
FIG. 8 illustrates a cross section of the combination of the sensor from FIG. 4, the support from FIG. 5, and the cover from FIG. 7 to form one embodiment of a sensor assembly.
Figure 9:
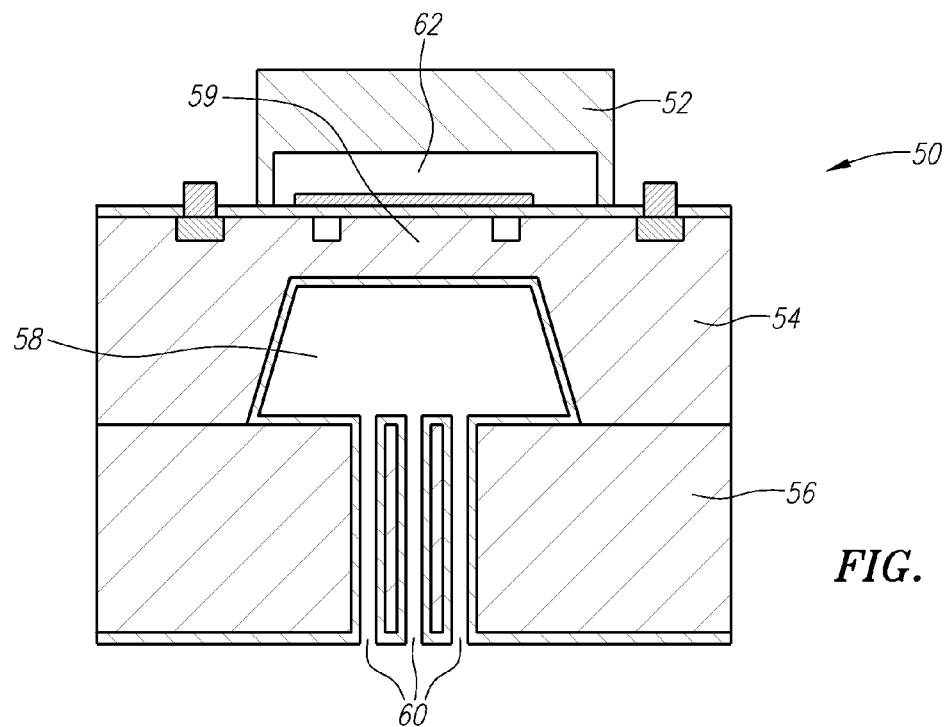
FIG. 9 illustrates the sensor assembly of FIG. 8 with the sides of the cover diced off.

FIG. 8 illustrates a cross section of the combination of the sensor 54, support 56 and cover 52 to form a sensor assembly 50. In a preferred embodiment, the cover 52 is silicon-to-silicon bonded to the top of the sensor 54. The stack of three silicon wafers bonded together may then be Ti/Pt/Au deposition on the bottom side of the wafer stack. FIG. 9 illustrates the sensor assembly of FIG. 8 with the sides of the cover 52 diced off.

Figure 10:
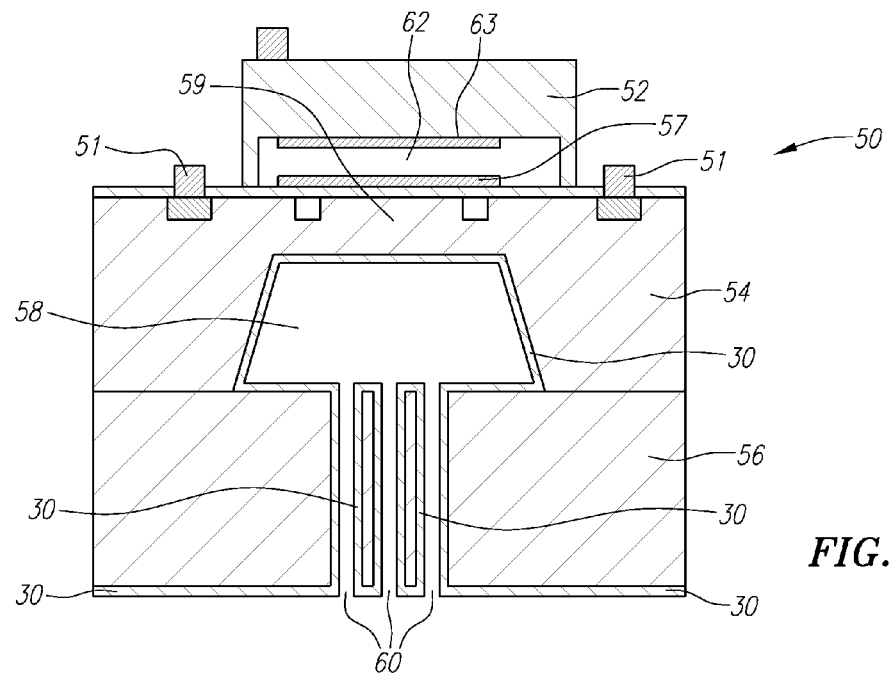
FIG. 10 illustrates a cross section of one embodiment of a sensor assembly designed to electronically detect the maximum displacement of the diaphragm.

FIG. 10 illustrates a cross section of one embodiment of a sensor assembly designed to electronically detect the maximum displacement of the diaphragm. As may be seen in FIG. 10, a conductive layer 63 is deposited on the bottom of the cavity 62 in the cover 52. In addition, a conductive layer 57 is deposited on the top of the diaphragm 59. When the diaphragm flexes to its maximum displacement, the two conductive layers 57 and 63 come in contact and complete a circuit. The completion of the circuit is detected and the system knows the diaphragm has reached its maximum displacement. In preferred embodiments, detection of the maximum displacement may cause an action to reduce or remove the over pressure condition.

As may also be seen in FIG. 10, the dielectric layer covers the inside of the cavity 58 and the inside of the ports/channels 60. Accordingly, the dielectric layer 30 electrically isolates the cavity 58 and the ports/channels 60 from the sensor 54. As may be seen in this embodiment, the sensor 54 and the support 56 are coupled directly together.

Figure 11:
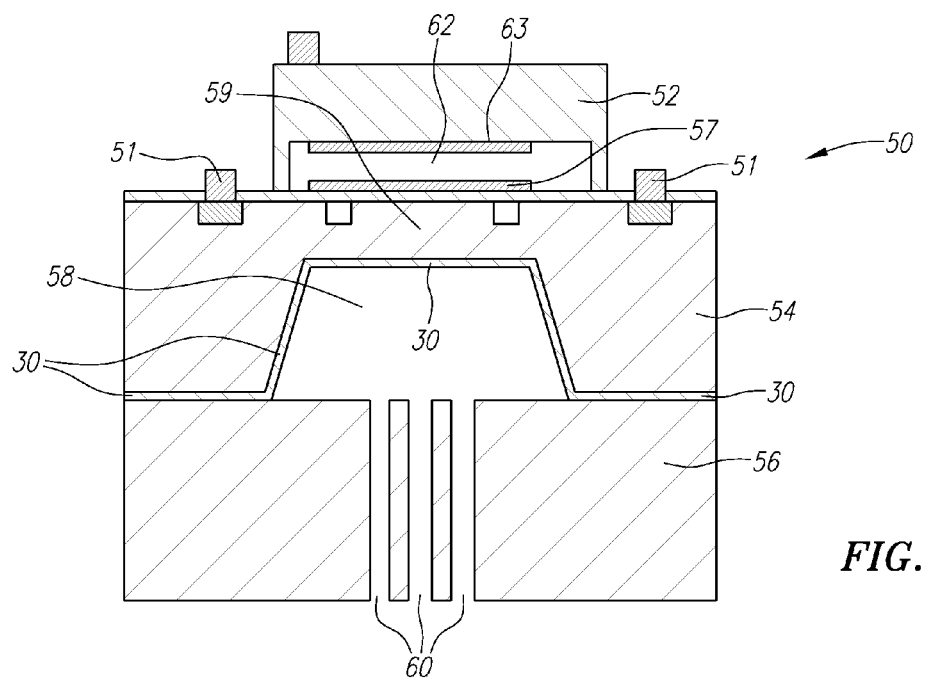
FIG. 11 illustrates a cross section of one embodiment of a sensor assembly with the dielectric layer configured differently from the embodiment of FIG. 10.

FIG. 11 illustrates a cross section of one embodiment of a sensor assembly with the dielectric layer configured differently from the embodiment of FIG. 10. As may be seen in FIG. 11, rather than covering all of the cavity 58 and the ports 60, the dielectric layer 30 covers the entire bottom surface of the sensor 54. Although the dielectric layer is configured different in the embodiment of FIG. 11, it serves the same function of electrically isolating the sensor 54 from the support 56. As may be seen in FIG. 11, in such an embodiment the sensor 54 is not coupled directly to the support 56 because the dielectric layer 30 is placed between them.

Although the embodiments have been described with reference to preferred configurations and specific examples, it will readily be appreciated by those skilled in the art that many modifications and adaptations to the pressure sensors and process of making the same are possible without departure from the spirit and scope of the embodiments as claimed hereinafter. Thus, it is to be clearly understood that this description is made only by way of example and not as a limitation on the scope of the embodiments as claimed below.

What is claimed is:

1. A method for manufacturing a pressure sensor assembly comprising:
    forming a sensor from a first silicon wafer by creating a cavity that extends up into the first silicon wafer from a bottom;
    forming a conductive layer over the top of the first silicon wafer;
    forming a support from a second silicon wafer by creating a plurality of channels that pass through the second silicon wafer from a top surface to a bottom surface;
    bonding the bottom of the first silicon wafer to the top surface of the second silicon wafer such that a chamber is formed by the cavity and the plurality of channels open into the chamber;
    forming a dielectric layer that electrically isolates the chamber from the sensor;
    forming a cover from a third silicon wafer by creating a second cavity that extends up into the third silicon wafer from a bottom; and
    bonding the bottom of the third silicon wafer to a top of the first silicon wafer such that the second cavity surrounds the diaphragm.

2. The method of manufacturing a pressure sensor assembly of claim 1, wherein a depth of the second cavity is cut to mechanically limit motion of the diaphragm to less than 3 times a full-scale pressure displacement.

3. The method of manufacturing a pressure sensor assembly of claim 1, wherein a depth of the second cavity is less than or equal 0.9 μm.

4. The method of manufacturing a pressure sensor assembly of claim 1, wherein the dielectric layer is made of silicon dioxide or silicon nitride.

5. The method of manufacturing a pressure sensor assembly of claim 1, wherein the dielectric layer separates the sensor from the support.

6. The method of manufacturing a pressure sensor assembly of claim 1, wherein the dielectric layer covers the surfaces of the chamber.

7. The method of manufacturing a pressure sensor assembly of claim 1, further comprising bonding a substrate to the bottom surface of the support, the substrate including a channel that runs from a top of the substrate to a bottom of the substrate and wherein a channel opening at the top of the substrate covers the plurality of channels on the bottom surface of the support.

8. The method of manufacturing a pressure sensor assembly of claim 1, further comprising forming a conductive layer on a bottom of the cavity of the third silicon wafer.

9. The method of manufacturing a pressure sensor assembly of claim 8, further comprising forming an electrical contact on a top of the third silicon wafer connected to the conductive layer on the bottom of the cavity of the third silicon wafer.

10. The method of manufacturing a pressure sensor assembly of claim 1, wherein a conductive layer on the top side of the diaphragm comes into contact and forms a closed circuit with the conductive layer on the bottom of the second cavity when the diaphragm displaces into the full depth of the second cavity.

11. A method for manufacturing a pressure sensor assembly comprising:
    forming a sensor from a first silicon wafer wherein the sensor includes a diaphragm;
    forming an electrical circuit on the top of the sensor;
    forming a support from a second silicon wafer;
    bonding a bottom of the first silicon wafer to a top surface of the second silicon wafer such that a chamber, encapsulated by the first silicon wafer and the second silicon wafer, is formed;
    creating a plurality of channels that pass through the second silicon wafer from the chamber to a bottom surface of the second silicon wafer;
    forming a dielectric layer that electrically isolates the chamber from the sensor;
    forming a cover from a third silicon layer; and, bonding a bottom of a third silicon wafer to a top of the first silicon wafer such that a gap above the diaphragm remains between the sensor and the cover.

12. The method of manufacturing a pressure sensor assembly of claim 11, wherein the gap is less than 3 times a full-scale pressure displacement of the diaphragm.

13. The method of manufacturing a pressure sensor assembly of claim 11, wherein the gap is less than or equal 0.9 μm.

14. The method of manufacturing a pressure sensor assembly of claim 11, wherein the dielectric layer is made of silicon dioxide or silicon nitride.

15. The method of manufacturing a pressure sensor assembly of claim 11, wherein the dielectric layer separates the sensor from the support.

16. The method of manufacturing a pressure sensor assembly of claim 11, wherein the dielectric layer covers the surfaces of the chamber.

17. The method of manufacturing a pressure sensor assembly of claim 11, further comprising forming a second conductive layer on a surface of the gap opposite the conductive layer above the diaphragm.

18. The method of manufacturing a pressure sensor assembly of claim 17, further comprising forming an electrical contact on a top of the third silicon wafer in electrical communication with the second conductive layer.

19. The method of manufacturing a pressure sensor assembly of claim 17, wherein the conductive layer comes into contact and forms a closed circuit with the second conductive layer when the diaphragm displaces into the full depth of the chamber.

* * * * *